United States Patent [19]

Lee

[11] Patent Number: 4,475,200

[45] Date of Patent: Oct. 2, 1984

[54] SEMICONDUCTOR LASER BEAM SCANNER

[75] Inventor: Chien-Ping Lee, Pasadena, Calif.

[73] Assignee: Rockwell International Corporation, El Segundo, Calif.

[21] Appl. No.: 327,010

[22] Filed: Dec. 3, 1981

[51] Int. Cl.³ .............................................. H01S 3/19
[52] U.S. Cl. ..................................... 372/46; 357/17; 372/50; 372/24
[58] Field of Search .................... 372/45, 46, 50, 24; 357/17

[56] References Cited

U.S. PATENT DOCUMENTS 4,212,020  7/1980  Yariv et al. ........................ 372/50
4,217,561  8/1980  Scifres et al. ....................... 372/46

Primary Examiner—James W. Davie
Attorney, Agent, or Firm—H. Fredrick Hamann; Craig O. Malin

[57] ABSTRACT

A heterojunction-type laser is constructed with two closely spaced p-n junctions. Ohmic contacts are provided on both sides of the p-n junctions so that the voltages across the junctions can be individually controlled. By controlling the ratio of the voltages, the carrier distribution in the lasing active layer is controlled. This in turn controls the direction of the output beam of the laser in accordance with the ratio of the voltages, providing a laser beam which can be scanned without requiring mechanical means.

3 Claims, 4 Drawing Figures

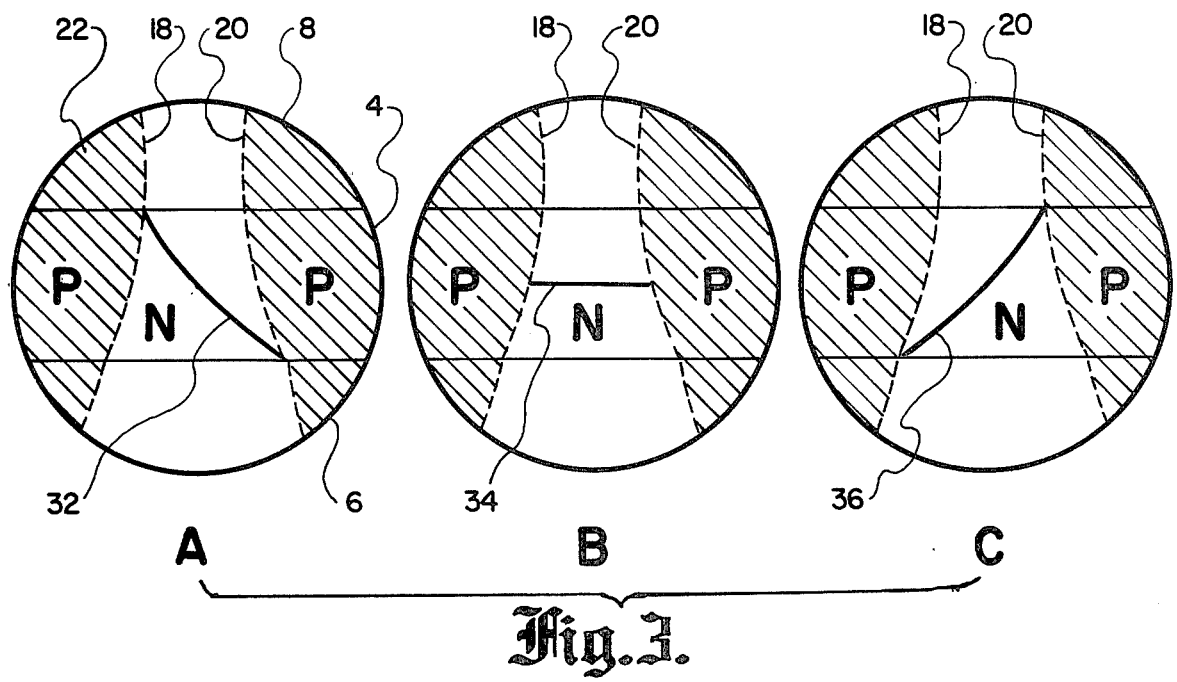
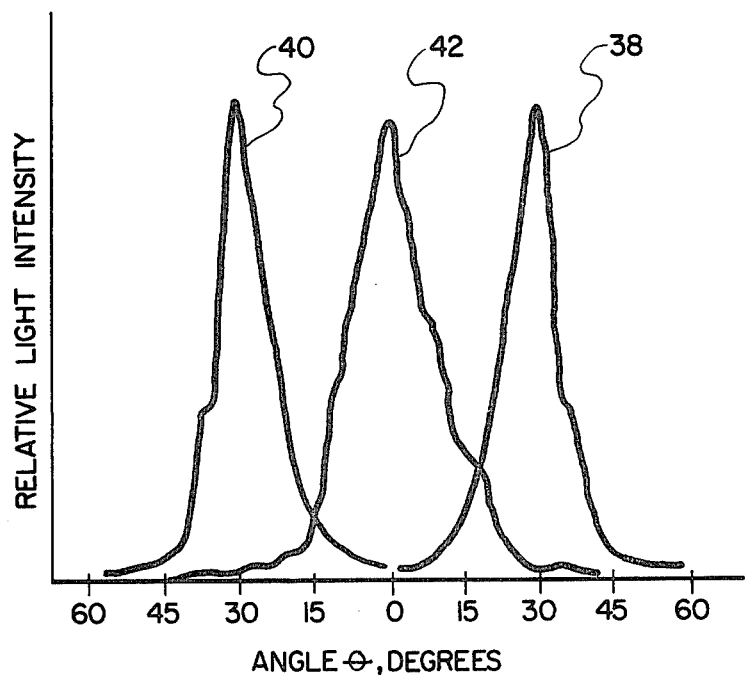
Fig.3.
Fig.4.

SEMICONDUCTOR LASER BEAM SCANNER

BACKGROUND OF THE INVENTION

This invention relates to the field of solid state devices and particularly to the field of solid state lasers.

A wide variety of solid state lasers has been developed for providing an optical output beam. These various lasers are described by their geometry or by their mode of operation such as stripe-geometry lasers, heterostructure lasers, transverse junction stripe lasers, crowding effect lasers, laterally diffused junction lasers, and injection lasers.

In many applications for lasers, it is required that the laser beam be moved or scanned, for example, for laser writing or laser reading. Prior art scanning lasers use moving mirrors, acousto-optical devices, or other mechanical systems to control the direction and movement of the output beam. The inertia, friction, and other characteristics of mechanical devices limit the speed, response, and reliability of such mechanical scanning lasers.

SUMMARY OF THE INVENTION

It is an object of the invention to provide a semiconductor laser beam scanner having electrical means for scanning the beam.

It is an object of the invention to provide a semiconductor laser beam scanner that does not require mechanical movement to scan the output laser beam.

It is an object of the invention to provide a semiconductor laser beam scanner which can scan at high speed.

It is an object of the invention to provide a semiconductor laser beam scanner which has a high deflection angle.

According to the invention, the direction of the output beam of a laser is controlled by controlling the carrier distribution in the active lasing layer. The carrier distribution, in turn, determines the gain profile in the active lasing layer of the laser. As described later, the gain profile determines the direction of the laser beam as it exits from the mirror surface of the laser.

In one embodiment of the scanner, an active layer is sandwiched between two confining layers on top of a semi-insulating substrate. These layers are formed of n-type conductivity materials. Two closely spaced, laterally diffused, p-n junctions are formed in these layers by diffusion from the top of the layers into the substrate. Ohmic contacts are formed on the top layer on both sides of both p-n junctions. Electronic means are provided to control the voltage across each p-n junction. This causes the direction of the output beam of the laser to vary in accordance with variations in the ratio of these two voltages.

In another embodiment of the invention, the active and confining layers are formed on top of an n-type substrate rather than on top of a semi-insulating substrate. The two p-n junctions extend through these active and confining layers to just short of the n-type substrate. Two ohmic contacts are formed on the top layer above the p-type diffused regions as in the previous embodiment. However, the third ohmic contact to the n-type region is placed on the bottom of the substrate. Thus, the lasing current flows across the two p-n junctions from the top of the layers to the bottom of the substrate rather than across the p-n junctions between ohmic contacts on the top of the layers, as in the first mentioned embodiment. By controlling the ratio of the voltages across these two p-n junctions, the direction of the output laser beam is controlled as in the previous embodiment.

These and other objects and features of the invention will be apparent from the following detailed description taken with reference to the accompanying drawings.

BRIEF DESCRIPTION OF THE DRAWINGS

FIG. 3 is a view of the active region of the laser beam scanner showing the carrier distribution across the active layer for three different voltage ratios; and FIG. 4 is a plot of the light intensity vs angle for the three carrier distributions shown in FIG. 3.

DESCRIPTION OF THE PREFERRED EMBODIMENT

Figure 1:
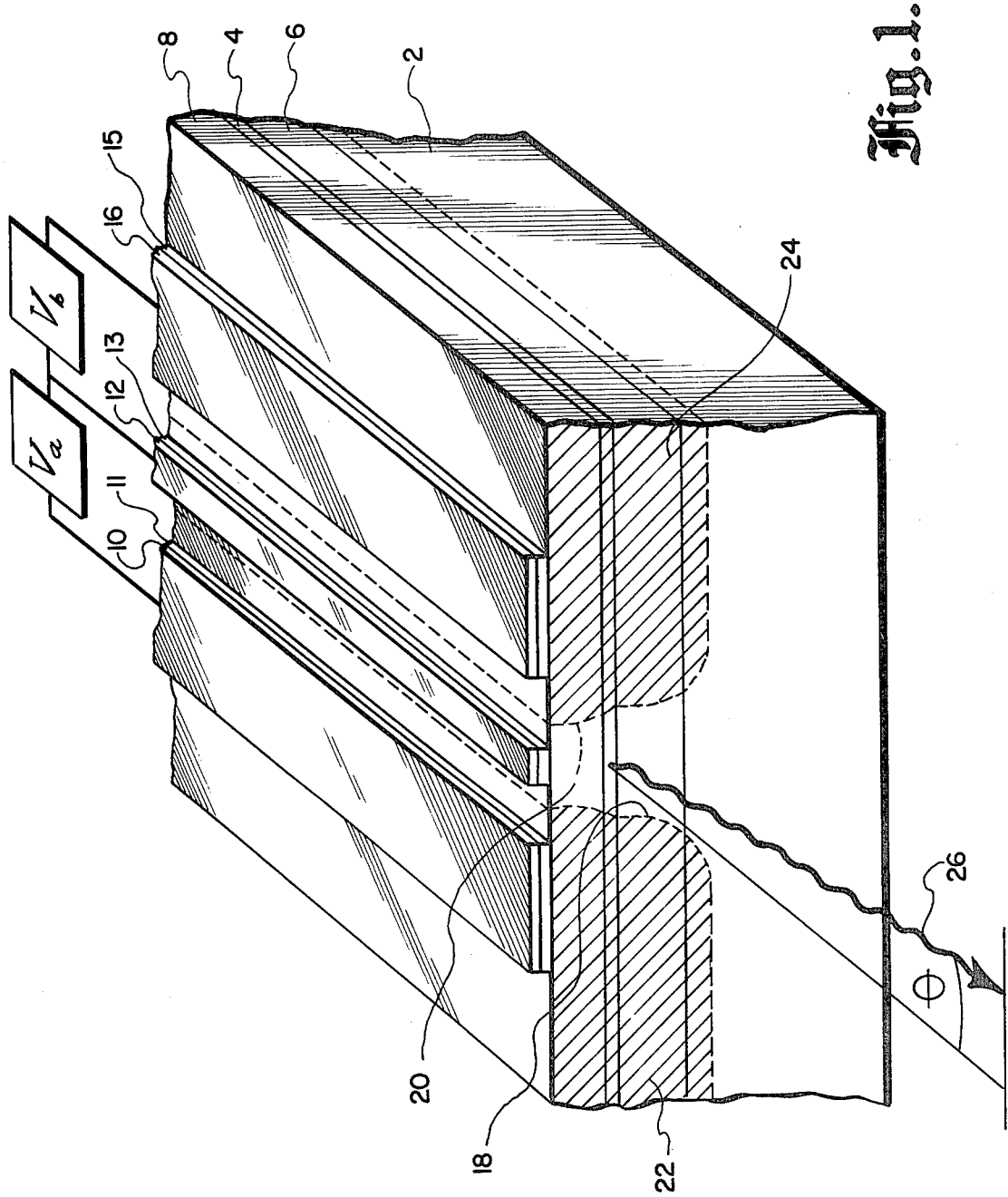
FIG. 1 is a perspective view showing a section of a laser beam scanner according to a semi-insulating substrate embodiment of the invention.

FIG. 1 shows a preferred embodiment of the invention utilizing a semi-insulating substrate 2 which supports three epitaxial layers, an active layer 4 sandwiched between confining layers 6, 8. Because substrate 2 is semi-insulating, current does not flow across the substrate but is confined to epitaxial layers 4, 6, 8. Thus, all electrical contacts 10, 12, 16 are located on the top surface, a useful feature previously described in U.S. Pat. No. 4,212,020 to A. Yariv, S. Margalit, and C. Lee (the present inventor).

Unlike previous lasers, the laser according to the invention has two, closely spaced apart, p-n junctions 18, 20 formed by diffusion regions 22, 24. Ohmic contacts 10, 16 are formed above diffusion regions 22, 24. Ohmic contact 12 is provided above the undiffused area and provides a common contact to the opposite conductivity type material for the two p-n junctions 18, 20.

Voltage control means, $V_a$ and $V_b$, are connected to the three contacts so that the voltages across p-n junction 18 and p-n junction 20 can be controlled.

The fabrication of the laser shown in FIG. 1 used liquid phase epitaxy (LPE) techniques and semiconductor material that are known in the art. For example, substrate 2 can be semi-insulating GaAs and LPE techniques can be used to grow $Ga_{1-x}Al_xAs$ and GaAs layers 6, 4, 8 on top of the substrate. In one example, confining layer 6 is $Ga_{.55}Al_{.45}As$, active layer 4 is GaAs, and second confining layer 8 is $Ga_{.55}Al_{.45}As$. The three epi-layers are doped with tin to provide n-type conductivity and their thicknesses are 3, 0.3, and 2 μm, respectively.

A mask is deposited on top of layer 8 and zinc is selectively diffused into the epi-layers to form two, spaced-apart p-type conductivity regions 22, 24. After diffusion, the part is heat treated at 860° C. and metal contacts 10, 16 of Au-Zn on the p side and contact 12 of Au-Ge on the n side are applied separately. To provide lower resistance, a thin layer 11, 13, 15 of GaAs can be deposited on layer 8 before diffusion.

In operation, current flows laterally across both p-n junctions from p-type contacts 10, 16 to n-type contact 12. Since GaAlAs has a wider bandgap than GaAs, carriers are injected predominately across p-n junctions 18, 20 into the active GaAs layer 4. Laser beam 26 exits from the cleaved mirror face of the device at an angle $\theta$. The value of angle $\theta$ depends upon the ratio value of Va/Vb as explained later.

Figure 2:
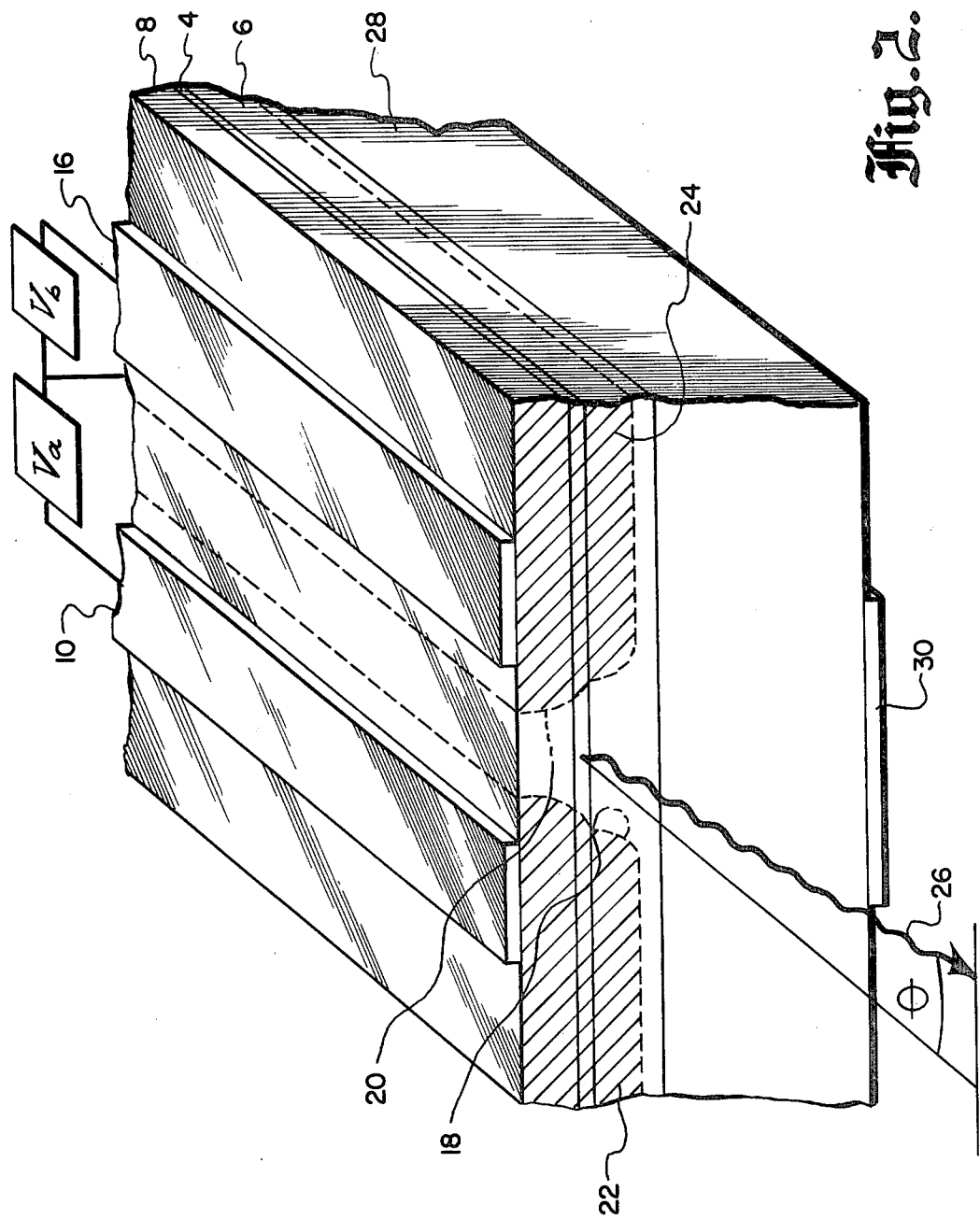
FIG. 2 is a perspective view showing a section of a laser beam scanner according to a n-type substrate embodiment of the invention.

FIG. 2 shows a second embodiment of the invention which utilizes a n-type substrate 28 rather than a semi-insulating substrate as in the FIG. 1 embodiment. Consequently, current can flow from the top of the device across the semi-conducting substrate to contact 30 to create laser beam output 26. Thus, the n-type substrate embodiment is similar to the embodiment shown in FIG. 1 except that the single contact 30 on the n-type material is located on the substrate surface opposite the surface on which the two contacts 10, 16 on the p-type region are located.

An important feature of the invention is the fact that angle $\theta$ at which laser beam 26 exits the laser can be varied by varying the ratio of Va to Vb. This is accomplished by a phenomenon called gain induced guiding. The gain depends upon the carrier concentration in the active layer. As illustrated in FIG. 3, the carrier concentration in the active layer can be changed by changing the voltages Va and Vb across the p-n junctions 18, 20. Views A, B, and C represent cross-sections of the laser in active layer 4 adjacent p-n junctions 18, 20. Curves 32, 34, 36 are generalized plots of the carrier concentration (vertical axis) vs distance between the p-n junction (horizontal axis) for three different ratios of Va to Vb.

The sections shown in FIG. 3 and the carrier distribution curves 32, 34, 36 are analogous to the PNP transistor in that the carrier distribution in the base region of a transistor is controlled by the voltages of the emitter and the collector junctions. FIG. 3A represents the concentration of carriers when Va/Vb is greater than 1 or when Vb is negative. There is a greater concentration of carriers adjacent p-n junction 18 than p-n junctions 20. This assymmetric distribution of carriers provides an assymmetric gain profile.

When Va/Vb is less than 1 or when Va is negative, a similar assymmetric distribution of carriers is obtained except that the greater concentration of carriers is adjacent p-n junctions 20 as shown in FIG. 3C. When Va=Vb, the concentration of carriers is symmetrical as shown in FIG. 3B.

The three carrier concentration profiles correspond to three far-field patterns of the laser beam as shown in FIG. 4. When Va is greater than Vb (FIG. 3A), the beam is shifted to the right as shown by curve 38. When Va is less than Vb (FIG. 3C), the beam is shifted to the left as shown by curve 40. And when Va equals Vb (FIG. 3B), the beam is not shifted as shown by curve 42.

As shown by FIG. 4, the direction of the laser beam depends strongly on the ratio of voltages across the two p-n junctions. This can be explained qualitatively as follows. The voltages applied across the two p-n junctions control the carrier distribution in the active layer as shown in FIG. 3. The gain profile, in turn, is determined by the carrier distribution, and the laser light generated in the active region is guided along the cavity by the gain profile. If the gain profile decays to one side (as in the case for carrier distributions such as shown in FIGS. 3A and 3C), the solution of the wave equation in such a gain medium shows that the guided modes have wavefronts pointing toward the side with low carrier concentration. Consequently, as the laser beam exits from the mirror surface, it propagates toward the side with low carrier concentration as determined by the ratio of Va to Vb.

Numerous variations and modifications can be made without departing from the invention. For example, other semi-conducting material combinations may be used such as InP-GaInAsP. Double junctions of n-p-n type rather than p-n-p type can be incorporated in some designs. Numerous means for controlling the voltages across the two p-n junctions are readily available. Accordingly, it should be clearly understood that the form of the invention described above and shown in the accompanying drawings is illustrative only and is not intended to limit the scope of the invention.

What is claimed is:

1. In a semiconductor laser beam scanner comprising:
   a semi-insulating substrate;
   a first confining layer of a first-type conductivity on said substrate;
   an active layer of said first-type conductivity on said first confining layer;
   a second confining layer of said first-type conductivity on said active layer;
   a first region of opposite-type conductivity extending from the top of said second confining layer down into said substrate;
   a second region of opposite-type conductivity extending from the top of said second confining layer down into said substrate, said second region being spaced from said first region so that a first-type conductivity zone separates said first and second regions of opposite-type conductivity;
   a first ohmic contact on said second confining layer positioned above said first region of opposite-type conductivity;
   a second ohmic contact on said second confining layer positioned above said second region of opposite-type conductivity;
   a third ohmic contact on said second confining layer positioned above said first-type conductivity zone; and
   means for applying a voltage between said first and third ohmic contacts and between said second and third ohmic contacts.

2. The scanner as claimed in claim 1, wherein said semi-insulating substrate comprises semi-insulating GaAs, said first and second confining layers comprise GaAlAs, and said active layer comprises GaAs.

3. The scanner as claimed in claims 1 wherein said first-type conductivity is n-type and said opposite-type conductivity is p-type.

* * * * *